(12) United States Patent
Fredrickson et al.

(10) Patent No.: US 7,082,564 B2
(45) Date of Patent: *Jul. 25, 2006

(54) HIGH THROUGHPUT REED-SOLOMON ENCODER

(75) Inventors: Lisa Fredrickson, Long Beach, CA (US); Bomey Yang, Santa Ana, CA (US)

(73) Assignee: Agere Systems Inc., Allentown, PA (US)

( * ) Notice: Subject to any disclaimer, the term of this patent is extended or adjusted under 35 U.S.C. 154(b) by 514 days.

This patent is subject to a terminal disclaimer.

(21) Appl. No.: 10/251,774

(22) Filed: Sep. 23, 2002

(65) Prior Publication Data

US 2004/0059989 A1    Mar. 25, 2004

(51) Int. Cl.
*H03M 13/00*    (2006.01)

(52) U.S. Cl. .................................................. 714/784

(58) Field of Classification Search ................ 714/784, 714/769, 774, 752; 375/141, 264; 370/412
See application file for complete search history.

(56) References Cited

U.S. PATENT DOCUMENTS

| | | | | |
|---|---|---|---|---|
| 5,341,396 A * | 8/1994 | Higgins et al. | ............. | 375/130 |
| 5,444,719 A * | 8/1995 | Cox et al. | ................... | 714/769 |
| 6,219,816 B1 * | 4/2001 | Tezuka | ....................... | 714/784 |
| 6,532,267 B1 * | 3/2003 | Heegard | ..................... | 375/253 |
| 6,574,193 B1 * | 6/2003 | Kinrot | ........................ | 370/229 |
| 6,826,723 B1 * | 11/2004 | Fredrickson | ............... | 714/784 |

* cited by examiner

*Primary Examiner*—Guy Lamarre
*Assistant Examiner*—Mujtaba Chaudry

(57) ABSTRACT

Reed-Solomon encoders providing support for multiple codes in a simple architecture having a reduced number of Galois field multipliers. Rather than implementing n subfilters each representing an individual degree polynomial filter as in conventional Reed-Solomon encoder, multiple degree polynomials are factored in a way which is convenient to a desired plurality of Reed-Solomon codes. Thus, not only are the number of required Galois field multipliers reduced, but support for different Reed-Solomon codes is provided with a minimized number of Galois field multipliers. Preferred embodiments in compliance with the proposed 802.16.1 wireless standard support up to sixteen Reed-Solomon codes all within a single architecture, including sixteen subfilters, either cascaded or in parallel. Each of the individual filters balances and reduces critical path lengths in the Reed-Solomon encoder, and reduces the loading of critical nets, resulting in a Reed-Solomon encoder with a greater throughput for a given technology.

11 Claims, 4 Drawing Sheets

HIGH THROUGHPUT REED-SOLOMON ENCODER

BACKGROUND OF THE INVENTION

1. Field of the Invention

This invention relates generally to Reed-Solomon encoders. More particularly, it relates to a high throughput 8-bit Reed Solomon encoder capable of producing R=2T bytes of redundancy where T=1 to 16, in compliance with the proposed 802.16.1 wireless standard.

2. Background

Reed-Solomon codes are block-based error correcting codes with a wide range of applications in digital communications and storage. Reed-Solomon codes are used to correct errors in many systems including storage devices (including tape, Compact Disk, DVD, barcodes, etc), wireless or mobile communications (including cellular telephones, microwave links, etc), satellite communications, digital television/DVB, high-speed modems such as ADSL, xDSL, etc., A Reed-Solomon encoder takes as input a block of digital data, comprising a sequence of digital information bits, and interprets it as a sequence of information symbols. Each such symbol comprises m bits of the digital information sequence. The block of input data comprises K such information symbols. The Reed-Solomon encoder produces R additional redundant symbols, which are concatenated with the K information symbols to form a codeword comprising N=K+R symbols. The parameters of the Reed-Solomon code are indicated by referring to such a code as an RS(N,K) code with m bit symbols.

Errors occur during transmission or storage for a number of reasons (for example noise or interference, scratches on a CD, etc). A Reed-Solomon decoder processes each block and attempts to correct errors and recover the original data. The number and type of errors that can be corrected depends on the characteristics of the Reed-Solomon code. In general, an RS(N,K) decoder can correct any combination of T=R/2 corrupted symbols provided that the remainder of the N symbols of the codeword are correct.

For instance, a Reed-Solomon encoder may include one popular Reed-Solomon code: RS(255,223) with 8-bit symbols. With this code, each codeword contains 255 code word bytes, of which 223 bytes are data and 32 bytes are parity. In this example, a matching Reed-Solomon decoder can automatically correct up to 16 byte errors anywhere in the codeword.

Reed-Solomon codes are based on a specialized area of mathematics known as abstract algebra, which includes the theory of finite fields, which are also known as Galois fields. A finite field has the property that arithmetic operations (add, multiply, exponentiate, etc.) on field elements always have a result in the field. A Reed-Solomon encoder or decoder needs to carry out these arithmetic operations. Reed-Solomon encoding (and/or decoding) can be carried out in software or in special purpose hardware.

A Reed-Solomon codeword is produced by utilizing polynomial division using the arithmetic of the Galois field. All valid codewords are exactly divisible by the generator polynomial.

The general form of the generator polynomial of a Reed-Solomon code is:

$$g(D) = \prod_{i=0}^{R-1} (D + \alpha^i)$$

$$= \sum_{i=0}^{R} g_i D^i$$

where the symbol $\alpha$ is a special element of the Galois field referred to as a primitive element, and R is the number of redundant symbols to be produced. When m=8 bits, the Galois field GF(256) is commonly generated by the primitive polynomial $$p(x) = x^8 + x^4 + x^3 + x^2 + 1$$

and is commonly represented in an $\alpha$-basis, as it is known in the literature. In this representation, an 8 bit binary symbol, c[7:0], is associated with the polynomial $$c(x) = \sum_{i=0}^{7} c[i] x^i$$

and the symbol $\alpha$ is represented by the binary string 00000010. The sum of two symbols is the bit-wise XOR of their binary representations, and the product of symbols b[7:0] and c[7:0] is the symbol a[7:0] associated with the polynomial $$a(x) = b(x) \cdot c(x) \text{ modulo } p(x).$$

The input to the encoder is the sequence of information symbols $$\{u_0, u_1, \ldots, u_{K-1}\}$$

which is interpreted as the polynomial $$u(D) = u_0 D^{K-1} + u_1 D^{K-2} + \ldots + u_{K-2} D + u_{K-1}$$

A polynomial division using the Galois field arithmetic processes this polynomial and the generator polynomial to produce a quotient polynomial q(x) and a remainder polynomial r(D) satisfying $$D^R u(D) = q(D) g(D) + r(D),$$

where $$r(D) = r_0 D^{R-1} + r_1 D^{R-2} + \ldots + r_{R-2} D + r_{R-1}$$

The codeword is formed by appending the R redundant symbols to the information symbols, forming the codeword sequence:

$$\{c_0, c_1, \ldots, c_{N-1}\} = \{u_0, u_1, \ldots u_{K-1}, r_0, r_1, \ldots, r_{R-1}\}$$

This sequence has the property that the polynomial:

$$c(D) = \sum_{i=0}^{N-1} c_i D^{N-1-i}$$

is divisible by the generator polynomial g(D).

An example generator polynomial for a Reed-Solomon code RS(255,249)

$$g(D)=(D-\alpha^0)(D-\alpha^1)(D-\alpha^2)(D-\alpha^3)(D-\alpha^4)(D-\alpha^5)$$

Using the Galois field arithmetic, the terms of this polynomial are multiplied to form the polynomial:

$$g(D)=D^6+g_5D^5+g_4D^4+g_3D^3+g_2D^2+g_1D+g_0$$

where $g_0, g_1, \ldots, g_5$ are specific symbols in the field.

U.S. Pat. No. 5,444,719 to Cox et al., entitled "Adjustable Error-Correction Composite Reed-Solomon Encoder/Syndrome Generator" (hereinafter "Cox"), discloses a conventional combined Reed-Solomon encoder/syndrome generator.

FIG. 1 of the present application shows a block diagram of relevant portions of a conventional Reed-Solomon encoder/syndrome generator disclosed, e.g., in FIG. 2 of Cox.

In particular, as shown herein in FIG. 1, the large circles labeled with generator coefficients $g_i$, $110_0$, $110_1$, $110_2$–$110_n$ represent constant multipliers over a Galois field. These generator coefficient multipliers $g_i$ $110_0$, $110_1$, $110_2$–$110_n$ tend to dominate the critical net loading, gate count and routing area of a Reed-Solomon encoder. $115_0$, $115_1$, $115_2$–$115_n$ are registers and the smaller circles labeled with a "+" are Galois field adders $120_1$, $120_2$–$120_n$ and 125 each consisting of m XOR gates.

A disadvantage of the conventional architecture, e.g., as shown in FIG. 1, is that it does not lend itself easily to supporting more than one specific Reed-Solomon code. This is because the generator coefficients mostly change when a differing number of redundant bytes are to be produced for each of the different Reed-Solomon codes.

The digital filter H(D) 100 of the Reed-Solomon encoder shown in FIG. 1 has a transfer function of the form:

$$H(D)=Y(D)/X(D)=1+1/(\Sigma g_iD^{R-i})$$

where the summation $\Sigma$ runs from i=0 to i=R in steps of 1. This transfer function can be re-expressed as $$H(D)=1+\Pi H_i(D)$$

where the product $\Pi$ runs from i=0 to i=R–1 in steps of 1, and $$H_i(D)=1/(1+\alpha^iD).$$

Cox discloses how to produce a Reed-Solomon encoder by cascading R filters with transfer functions of the form $H_i(D)$ as described above, where i=0, 1, ..., R–1.

One advantage of the implementation disclosed by Cox is that each of the filters $H_i(D)$ can also be used independently to produce the decoder syndrome S, used in a complementary Reed-Solomon decoder. Cox uses the R filters $H_i(D)$ in cascade to perform the Reed-Solomon encoding function, and in parallel to perform the first step of Reed-Solomon decoding. This reduces the amount of hardware required in an implementation utilizing a Reed-Solomon encoder and decoder in the same integrated circuit chip.

Perhaps the most distinctive feature of Cox's Reed-Solomon encoder is that it implements individual degree polynomial filters. In particular, Cox teaches the use N subfilters, each of degree 1, which are cascaded to produce an encoder transfer function. Cox teaches that these N subfilters can also be used as syndrome calculators. Cox's individual stages of the cascaded filter can be easily disabled, providing for the ability to produce varying amounts of redundancy from the same basic circuit.

However, a disadvantage of Reed-Solomon encoders such as are disclosed by Cox is that the critical path of the Reed-Solomon encoder can be quite long for large values of R.

A need arises from the proposed 802.16.1 wireless communications standard for an encoder that operates with higher throughput rates and supports sixteen different amounts of redundancy, i.e. T=1 to 16.

SUMMARY OF THE INVENTION

In accordance with the principles of the present invention, a multi-rate Reed-Solomon coding device comprises a plurality of multiple degree subfilters. The maximum number of bytes of redundancy provided by the Reed-Solomon coding device is equal to the sum of the degrees of the plurality of subfilters.

A method of providing multiple Reed-Solomon codes in a single coding device in accordance with another aspect of the invention comprises providing a plurality of multiple degree subfilters, and enabling a selected number of the plurality of subfilters for each Reed-Solomon code.

Apparatus for providing multiple Reed-Solomon codes in a single coding device is also provided, comprising a plurality of means for filtering a data stream. The means for filtering is of a degree greater than one. Means for enabling a selected number of the plurality of means for filtering is included for each Reed-Solomon code.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
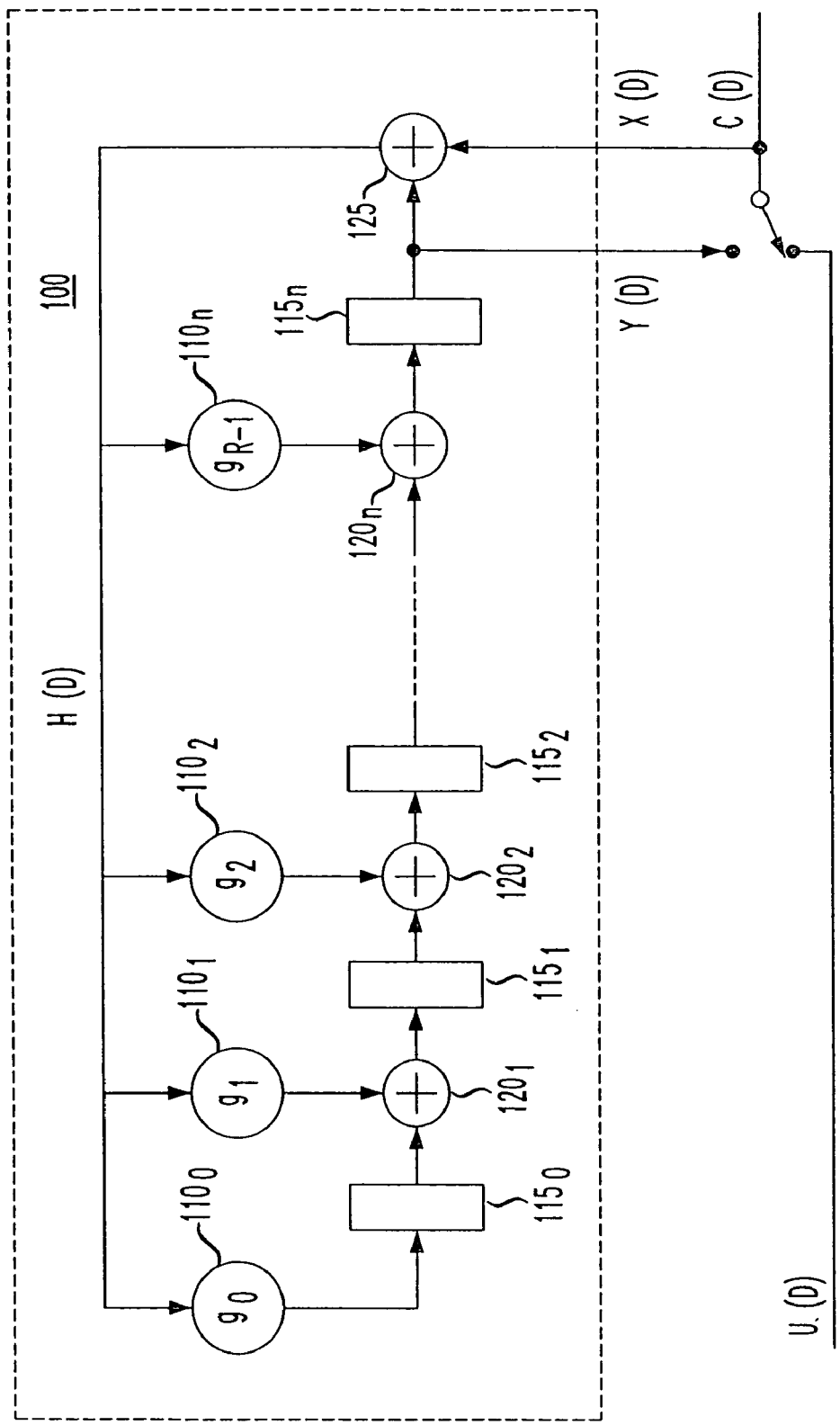
FIG. 1 of the present application shows a block diagram of relevant portions of the Reed-Solomon encoder/syndrome generator disclosed, e.g., in FIG. 2 of Cox.

The present invention provides for smaller, faster Reed-Solomon encoders, while at the same time provides support of multiple codes in a simple architecture having a reduced number of Galois field multipliers.

A multi-rate Reed-Solomon coding device is provided that comprises a cascade of up to 16 optionally used filter stages, or 'subfilters', and is modified for high throughput and minimal area. In one aspect, subfilter inputs are provided in parallel to reduce critical path delay.

In accordance with the principles of the present invention, a polynomial is factored differently than conventional Reed-Solomon encoders, resulting in a Reed-Solomon encoder having enhanced performance, simplified circuitry, and/or a reduction of critical paths. Thus, not only are the number of required Galois field multipliers reduced, but support for multiple rates, e.g., for sixteen different Reed-Solomon codes is provided with a minimized number of Galois field multipliers.

For instance, in the disclosed embodiments, rather than implementing N subfilters each representing an individual degree polynomial filter as in Cox's conventional Reed-Solomon encoder, the present invention implements multiple degree polynomials factored in a way which is convenient to a desired plurality of Reed-Solomon codes.

Two new embodiments of multi-rate Reed-Solomon encoders (shown in FIGS. 2 and 3, respectively) are disclosed to overcome limitations of conventional Reed-Solomon encoders, particularly with respect to the minimum required number of generator polynomials necessary for proper operation. As stated previously, conventional Reed Solomon encoders implement a filter with the transfer function $H(D)=1+F(D)$, where the "+" indicates Galois field addition, and the filter $F(D)$ is given by:

$$F(D)=1+\Pi H_i(D)$$

where the product $\Pi$ runs from $j=0$ to $j=R-1$ in steps of 1.

Cox et al. teach a factoring of the polynomial to a product of sub-polynomials of degree one, whereas these embodiments are derived using a different factoring of the polynomial $F(D)$, into multiple sub-polynomials whose degrees are greater than one.

A preferred embodiment of the invention supports sixteen Reed-Solomon codes all within a single architecture, including sixteen cascaded subfilters of the form:

$$F_j(D)=1+\Pi H_i(D)$$

where $j=0, 1, 2, \ldots,$ or 15 and the product $\Pi$ runs from $i=2j$ to $i=2j+1$.

Each of the individual subfilters balances and reduces critical path lengths in the Reed-Solomon encoder, and reduces the loading of critical nets, resulting in a Reed-Solomon encoder with a greater throughput for a given technology. In addition, the critical path of the encoder has been optimized by replacing a long serial path with a parallel adder structure.

For instance, the conventional Cox taught Reed-Solomon encoder would require, e.g., 24 subfilters to provide 24 bytes of redundancy, each subfilter having polynomial having a single degree. However, in accordance with the principles of the present invention, sixteen different Reed-Solomon codes may be provided, where the number of redundant bytes $R=2, 4, 6, \ldots,$ or 32, (i.e. up to 32 bytes of redundancy in steps of 2 bytes of redundancy), by optionally cascading up to sixteen multiple degree polynomial filters.

Figure 2:
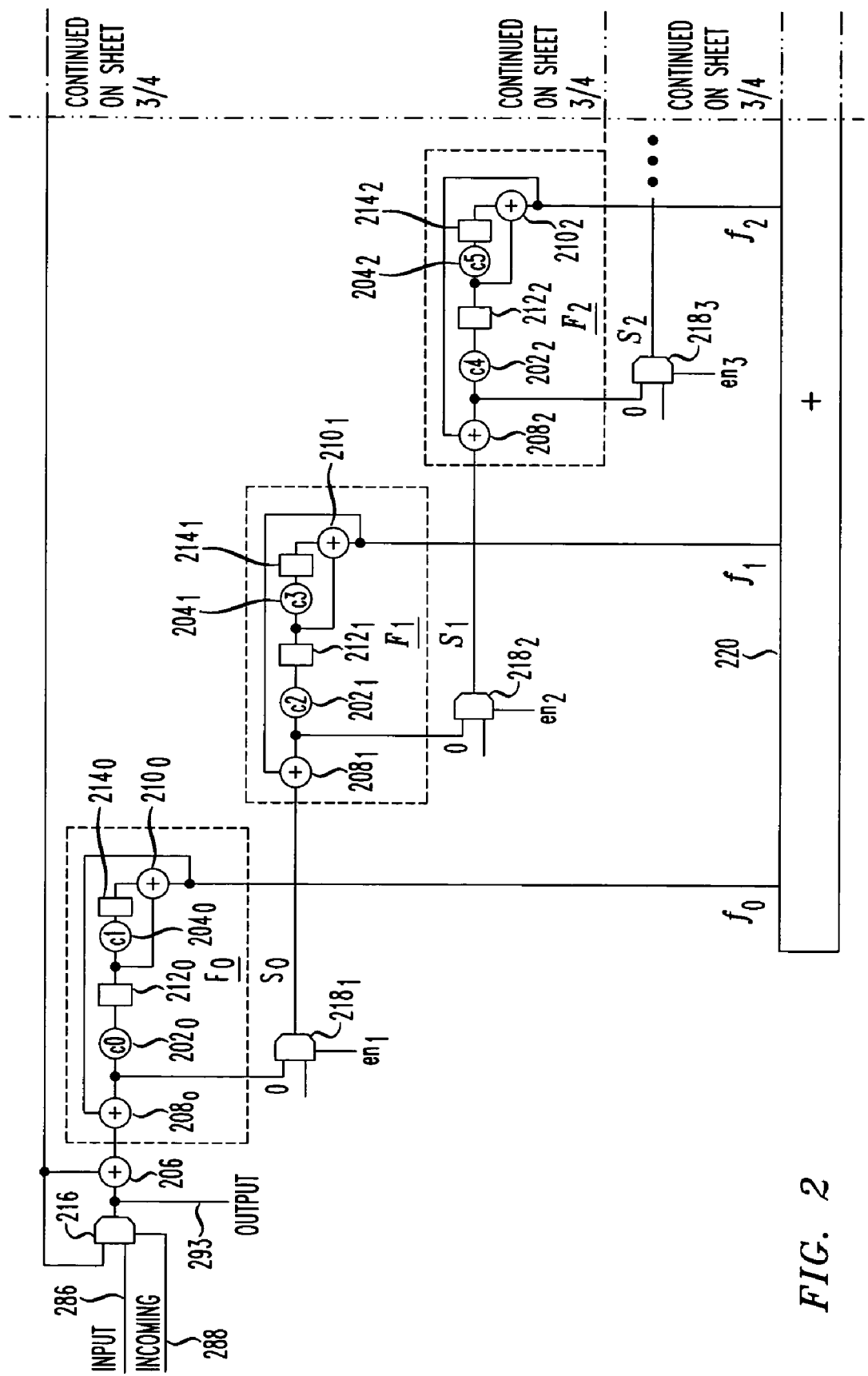
FIG. 2 shows an embodiment of the invention, a multi-rate Reed Solomon encoder which produces sixteen different Reed-Solomon codes, each of which is functionally equivalent to a conventional Reed Solomon encoder such as that shown in FIG. 1.
Figure 2:
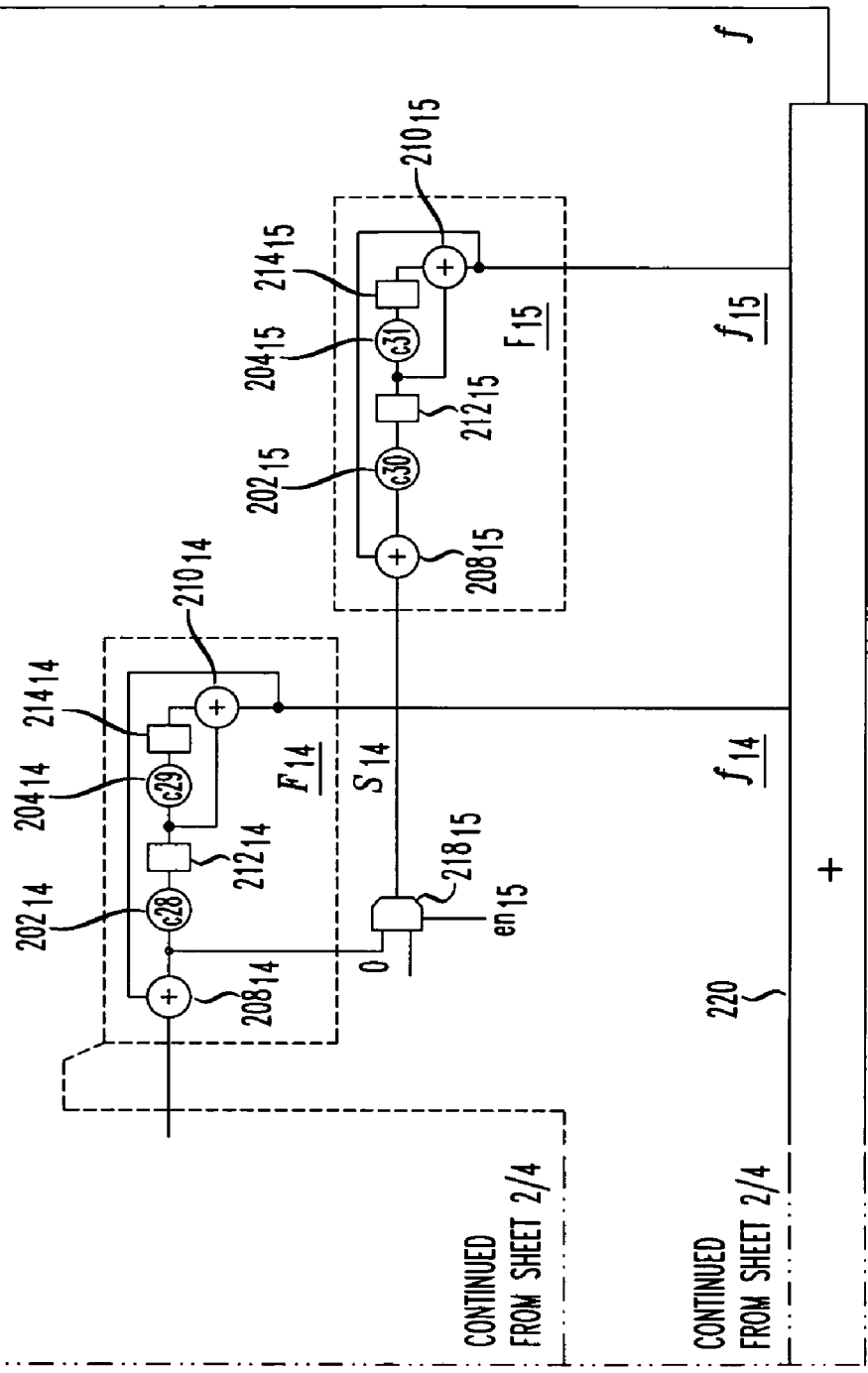

FIG. 2 is a block diagram of an encoder showing the factoring of the polynomial $F(D)$. $F(D)$ has been factored into 16 polynomials as indicated above. In FIG. 2, $202_0$, $202_1$, $202_2, \ldots, 202_{14}, 202_{15}$ and $204_0, 204_1, 204_2, \ldots, 204_{14}, 204_{15}$ represent constant multipliers, each multiplying by one of the hexadecimal constants $c_0, c_1, c_2, c_3, c_4, c_5, \ldots, c_{28}, c_{29}, c_{30}, c_{31}$ shown in the circles. The encoder also employs adders 206, $208_0, 208_1, 208_2, \ldots, 208_{14}, 208_{15}, 210_0, 210_1, 210_2, \ldots, 210_{14},$ and $210_{15}$ registers $212_0, 212_1, 212_2, \ldots, 212_{14}, 212_{15}$ and $214_0, 214_1, 214_2, \ldots, 214_{14}, 214_{15}$, multiplexers 216 and $218_1, 218_2, 218_3, \ldots, 218_{15}$, and summer 220. The circuit can be grouped into sixteen subfilters $F_0, F_1, F_2, \ldots, F_{15}$, each including two multipliers, two adders and two registers, for example subfilter block $F_0$ is made up of multipliers $202_0$ and $204_0$, adders $208_0$ and $210_0$, and registers $212_0$ and $214_0$.

Note that the critical path of FIG. 2 contains a large number of adders devoted to the cascade chain to each of the inputs of the 15 subfilters, denoted $s_0, s_1, s_2, \ldots, s_{15}$. When the incoming data is finished, there is a larger critical path when the feedback outputs of the subfilters, denoted $f_0, f_1, f_2, \ldots, f_{14}, f_{15}$ are summed by summer 220 to provide the input to the cascaded filter chain.

As discussed with respect to the conventional Reed-Solomon encoder, the critical path of a Cox et al. Reed-Solomon encoder includes R XOR gates in the cascaded subfilter inputs. The hexadecimal constants $c_0, c_1, c_2, c_3, c_4, c_5, \ldots, c_{28}, c_{29}, c_{30}, c_{31}$ shown in the circles $202_0, 202_1, 202_2, \ldots, 202_{14}, 202_{15}$ and $204_0, 204_1, 204_2, \ldots, 204_{14}, 204_{15}$ of FIG. 2 represent constant Galois field multipliers which multiply by the number they are each labeled with, each multiplying by a coefficient in the denominator of the polynomial $F_i(D)$.

An eight bit input bus 286 represents the data to be encoded. As bytes are input to the encoder, the incoming control signal 288 is asserted. An edge detector (not shown) which may be constructed form a one bit register, a NOT gate and an OR gate to produce a reset pulse that resets all registers having a reset at the beginning of input data to be encoded.

The incoming control signal 288 is also the select signal to an 8 bit multiplexer (mux) 216, so that when the incoming control signal 288 is asserted, the output bus 293, representing the output of the encoder, is the same as input bus 286. The output 293 of the mux 216 also provides an input signal to the cascaded subfilters.

The subfilters $F_0, F_1, F_2, \ldots, F_{15}$, each form a tapped delay line, where the outputs of the respective registers are multiplied and summed using Galois field arithmetic. The output of each subfilter is disabled when the reset pulse is activated, e.g., zero. The subfilters $F_1, F_2, \ldots, F_{15}$ are each enabled by enabling signals $en_1, en_2, \ldots, en_{15}$ supplied to multiplexers $218_1, 218_2, 218_3, \ldots, 218_{15}$ respectively. Subfilter $F_0$ is always enabled. Each (possibly disabled) subfilter output goes to two places, back to the input of the subfilter and to the common Galois field summer 220 at the bottom of FIG. 2.

On the first cycle of user data, the output signal 293 is registered at the beginning of each subfilter. On subsequent cycles, the optionally disabled subfilter feedback is summed with output signal 293 to create a new signal entering the register bank, and previously entering signals are clocked down the delay line. As the user data proceeds, the output of the bottom summer 220 is ignored.

At the end of user data, the incoming control signal 288 becomes zero. This causes the output of the mux 216 to become the output of the bottom summer 220, which becomes output signal 293 and the input to the sixteen subfilters. The circuit remains in this configuration until the desired number of redundant bytes have been produced.

Figure 3:
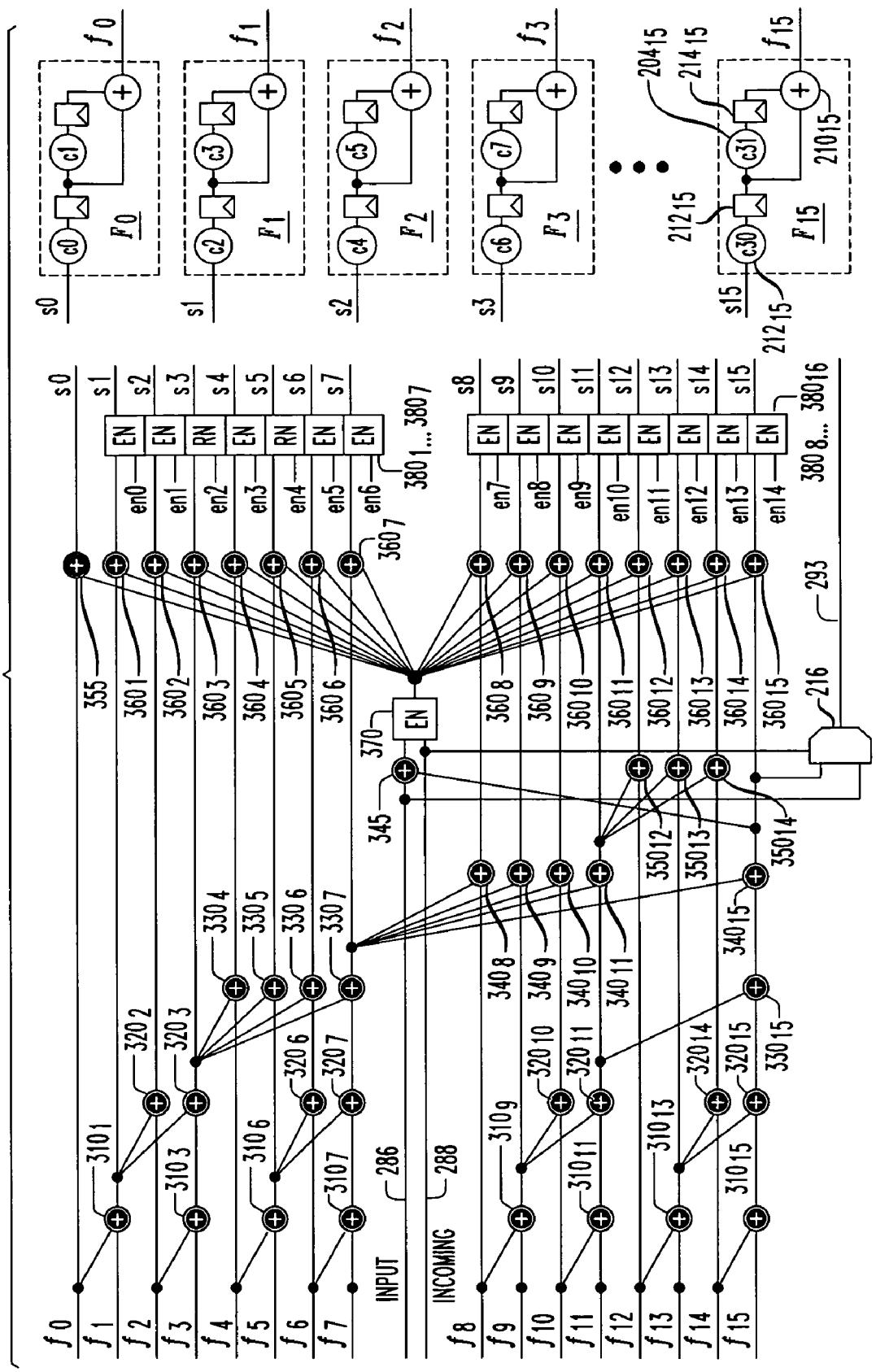
FIG. 3 is a detailed preferred embodiment of the invention, which is functionally equivalent to FIG. 2, but has a reduced critical path including only 11 XOR gates.

The preferred embodiment of FIG. 3 shows a Reed-Solomon encoder which has a reduced critical path containing only 11 XOR gates. It is functionally equivalent to FIG. 2, but with greatly reduced delay, supporting higher throughput. The circuitry of FIG. 3 provides the subfilter bank inputs $s_0, s_1, s_2, \ldots, s_{15}$ in parallel.

As in the embodiment of FIG. 2, there are sixteen subfilters denoted $F_0, F_1, F_2, \ldots, F_{15}$. Each subfilter includes two multipliers, and two registers but only one adder, not two as in the embodiment of FIG. 2. As an example, for example subfilter block $F_{15}$ is made up of multipliers $202_{15}$ and $204_{15}$, adder $210_{15}$, and registers $212_{15}$ and $214_{15}$.

In FIG. 3, rectangles 370 and $380_1$–$380_{15}$ represent m bit registers, all signals represent 8 bit busses, circles marked "+" represent Galois Field adders $310_1$–$360_{15}$ having m bitwise XOR gates. Registers $380_1$–$380_{15}$ receive enabling signals $en_1$, $en_2$, ..., $en_{15}$ to select the value of T from 1 to 16. Note that, when enabled, the cascaded subfilter inputs are as indicated in Table 1.

2. Cascaded Filter Inputs in Two Modes

| Cascaded Filter Input | When Incoming = 0 | When Incoming = 1 |
|---|---|---|
| $S_0$ | $f_1 + f_2 + \ldots + f_{15}$ | input + $f_0$ |
| $S_1$ | $f_2 + f_3 + \ldots + f_{15}$ | input + $f_0 + f_1 + \ldots + f_{15}$ |
| $S_2$ | $f_3 + f_4 + \ldots + f_{15}$ | input + $f_0 + f_1 + f_2$ |
| ... | ... | ... |
| $S_{14}$ | $f_{15}$ | input + $f_0 + f_1 + f_2 + \ldots + f_{15}$ |

Note that when incoming=1, $$s_{i,\,incoming} = \text{input} + \Sigma f_j,$$

where the summation $\Sigma$ runs from j=0 to i in steps of 1. If incoming=0 then $$s_i = s_{i,incoming} + [\text{input} + \Sigma f_p],$$

where the summation $\Sigma$ runs from p=0 to 15, using the addition of GF(256) where the sum of any field symbol x with itself is zero.

By optionally adding the bracketed term using the control signal incoming, the inputs to the subfilters can be provided in parallel in both modes, as shown in FIG. 3.

FIG. 3 is functionally equivalent to the circuit shown in FIG. 2, only the multipliers and registers have been somewhat rearranged. The multiplier constants have been chosen so as to produce the exact same subfilter outputs as FIG. 2.

It can be observed that the output of the sub-filter summation tree shown in FIG. 3 is the same as that of FIG. 2. However, instead of a worst-case multiplier, there is a smaller multiplier in the critical path of the Reed-Solomon encoder shown in FIG. 3, which contains a total of eleven (11) XOR gate delays. This smaller propagation delay results in improved throughput as compared to the implementation shown in FIG. 2, and certainly a much smaller propagation delay as compared to encoders such as those taught by Cox et al.

The Reed-Solomon encoders in accordance with the principles of the present invention provide support, in a single architecture, for multiple choices of redundancy. Thus, in accordance with the principles of the present invention, a single architecture produces 16 different codes with minimal hardware.

While the invention has been described with reference to the exemplary embodiments thereof, those skilled in the art will be able to make various modifications to the described embodiments of the invention without departing from the true spirit and scope of the invention.

What is claimed is:

1. A multi-rate Reed-Solomon coding device, comprising:
   an input bus to provide input data to be encoded by said multi-rate Reed-Solomon coding device; and
   a plurality of multiple degree sub-filters;
   wherein said plurality of multiple degree sub-filters is arranged such that respective sub-filter outputs thereof are output in parallel with one another; and
   wherein each of said sub-filters is individually enabled to process said input data to produce multiple numbers of redundant bytes provided by said multi-rate Reed-Solomon coding device.

2. A cordless telephone as recited in claim 1, wherein the call related information comprises Caller ID data.

3. A cordless telephone as recited in claim 1, wherein the selective connection is performed by a processor in at least one of said base unit and said handset.

4. A cordless telephone as recited in claim 1, wherein the call related information is transmitted by the base unit to the handset.

5. A cordless telephone, comprising:
   a base unit; and
   a handset;
   wherein an RF link between the base unit and the handset is adapted for use during a telephone conversation and for use as an intercom; and
   wherein, when in an intercom mode, call related information is presented to at least one of said base unit and said handset to allow selective connection of an incoming call simultaneously at at least one of said base unit and said handset while maintaining said intercom mode between said base unit and said handset; and
   wherein audio is attenuated prior to the transmission of the call related information.

6. A cordless telephone as recited in claim 4, wherein a signal is transmitted from the base unit to the handset prior to the transmission of the call related information.

7. A cordless telephone as recited in claim 6, wherein an acknowledge signal is transmitted from the handset to the base unit prior to the transmission of the call related information.

8. A cordless telephone as recited in claim 4, wherein the handset is adapted to display at least a portion of the call related information.

9. A cordless telephone as recited in claim 8, wherein the handset is adapted to receive user input and to provide a signal related to the user input to the base unit.

10. A cordless telephone as recited in claim 9, wherein the base unit is adapted to affect the intercom mode based on the signal related to the user input.

11. A method of handling an incoming call in a cordless telephone, comprising:
   establishing an intercom mode between a base unit and a handset of a cordless telephone; and
   selectively maintaining said intercom mode between said base unit and said handset based on incoming call related information analyzed automatically by a processor while an incoming call is added as a third party to said intercom mode with two-way communication with both said base unit and said handset;
   wherein audio is attenuated during reception of said call related information by said base unit.

* * * * *